(12) United States Patent
Huang et al.

(10) Patent No.: US 10,115,929 B2
(45) Date of Patent: Oct. 30, 2018

(54) OLED DEVICE ENCAPSULATION STRUCTURES, OLED DEVICES, AND DISPLAY PANELS

(71) Applicant: Wuhan China Star Optoelectronics Technology Co., Ltd., Wuhan, Hubei (CN)

(72) Inventors: Jinchang Huang, Guangdong (CN); Hsianglun Hsu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 62 days.

(21) Appl. No.: 15/111,008

(22) PCT Filed: Jun. 20, 2016

(86) PCT No.: PCT/CN2016/086346
§ 371 (c)(1),
(2) Date: Jul. 12, 2016

(87) PCT Pub. No.: WO2017/197699
PCT Pub. Date: Nov. 23, 2017

(65) Prior Publication Data
US 2017/0373279 A1    Dec. 28, 2017

(30) Foreign Application Priority Data
May 17, 2016   (CN) .......................... 2016 1 0325919

(51) Int. Cl.
*H01L 27/32* (2006.01)
*H01L 51/52* (2006.01)

(52) U.S. Cl.
CPC ...... *H01L 51/5268* (2013.01); *H01L 27/3204* (2013.01); *H01L 51/52* (2013.01); *H01L 51/524* (2013.01); *H01L 2251/53* (2013.01)

(58) Field of Classification Search
CPC .............. H01L 51/5268; H01L 51/524; H01L 27/3204
See application file for complete search history.

(56) References Cited

U.S. PATENT DOCUMENTS

| 2011/0186871 | A1* | 8/2011 | Vaufrey | ................ | H01L 51/524 257/88 |
| 2012/0256202 | A1 | 10/2012 | Lee et al. | | |
| 2014/0145979 | A1* | 5/2014 | Lee | ....................... | G06F 3/0412 345/173 |

FOREIGN PATENT DOCUMENTS

| CN | 101156245 A | 4/2008 |
| CN | 101412300 A | 4/2009 |

(Continued)

*Primary Examiner* — Joseph Galvin, III
(74) *Attorney, Agent, or Firm* — Andrew C. Cheng

(57) ABSTRACT

The present disclosure relates to a package structure of organic light emitting diode (OLED) components. The package structure includes an OLED body and an encapsulation layer having an organic layer, a protecting layer, a blocking layer, and a stressed layer. A first curved-surface area is formed on the organic layer, and the protecting layer, the blocking layer, and the stressed layer are stacked on the organic layer in sequence. The protecting layer, the blocking layer, and the stressed layer are respectively formed with a second curved-surface area. The second curved-surface area is stacked on the first curved-surface area and is overlapped with the first curved-surface area, and the second curved-surface area and the first curved-surface area form a folded area of the encapsulation layer. The present disclosure also relates to one OLED component and a display panel.

15 Claims, 3 Drawing Sheets

(56) References Cited

FOREIGN PATENT DOCUMENTS

| CN | 102593148 | A | | 7/2012 | |
|----|-----------|---|---|--------|--|
| CN | 103150965 | A | | 6/2013 | |
| CN | 103811668 | A | | 5/2014 | |
| CN | 104538425 | | * | 4/2015 | ............ H01L 27/32 |
| CN | 104538425 | A | | 4/2015 | |
| CN | 105206763 | A | | 12/2015 | |
| CN | 105552246 | A | | 5/2016 | |

\* cited by examiner

OLED DEVICE ENCAPSULATION STRUCTURES, OLED DEVICES, AND DISPLAY PANELS

CROSS REFERENCE

This application claims the priority of Chinese Patent Application No. 201610325919.7, entitled "OLED COMPONENT PACKAGE STRUCTURES, OLED COMPONENTS, AND DISPLAY PANELS", filed on May 17, 2016, the disclosure of which is incorporated herein by reference in its entirety.

FIELD OF THE INVENTION

The present invention relates to an liquid crystal display field, and more particularly to an OLED component package structure, an OLED component, and a display panel.

BACKGROUND OF THE INVENTION

With the development of the display technology, newly developed display technology has been applied to a variety of fields, such as wearable devices (smart bracelet or smart watch), virtual reality (VR) devices, mobile phones, e-books, e-papers, TVs, and notebooks.

The life cycle of Organic Light-Emitting Diode (OLED) is an important issue. As known, OLED components are very sensitive to water and oxygen, and black dots may formed in a light-emitting area if the component has not been packaged, and the black dots grow when the time pass by. Currently, the OLED may be packaged by a glass cover. However, thin film encapsulation is more suitable for folded/curled OLED. The most common solution relates to alternately depositing the polymer organic films and inorganic films on the surface of the OLED. The inorganic film is capable of blocking the water and the oxygen, and the polymer film is capable of absorbing and distributing the stress between the layers so as to prevent the water and oxygen barrier property from being decreased due to the crack of the inorganic films. However, the life cycle of such solution with respect to the folding is still low, and a smaller curling rate cannot be obtained.

SUMMARY OF THE INVENTION

The present disclosure relates to an OLED component with enhanced flexibility such that the folded life cycle is extended.

In one aspect, a package structure of organic light emitting diode (OLED) components includes: an OLED body and an encapsulation layer having an organic layer, a protecting layer, a blocking layer, and a stressed layer; a first curved-surface area is formed on the organic layer, the protecting layer, the blocking layer, and the stressed layer are stacked on the organic layer in sequence, the protecting layer, the blocking layer, and the stressed layer are respectively formed with a second curved-surface area, the second curved-surface area is stacked on the first curved-surface area and is overlapped with the first curved-surface area, and the second curved-surface area and the first curved-surface area form a folded area of the encapsulation layer.

Wherein the first curved-surface area includes a plurality of periodic cones or trenches arranged in a matrix, and the cones or the trenches are spaced apart from each other.

Wherein the packing structure includes a plurality of encapsulation layers and the encapsulation layer are stacked, and the organic layer and the stressed layers of every two adjacent encapsulation layers are bonded together.

Wherein an inorganic layer is stacked on the stressed layer.

Wherein the protection layer is formed on the organic layer by applying a vacuum evaporation process to transparent metal.

Wherein the blocking layer is formed by depositing inorganic material on the protection layer.

Wherein the stressed layer is made by polymer material.

Wherein the packing structure includes one folded area or a plurality of spaced folded areas.

In one aspect, the OLED component includes the above package structure.

In one aspect, a display panel includes the above OLED component.

The package structure of the OLED component includes a folded area having curved-surface areas to obtain better folding and curling effect. At the same time, the life cycle of the flexible OLED component may be extended.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
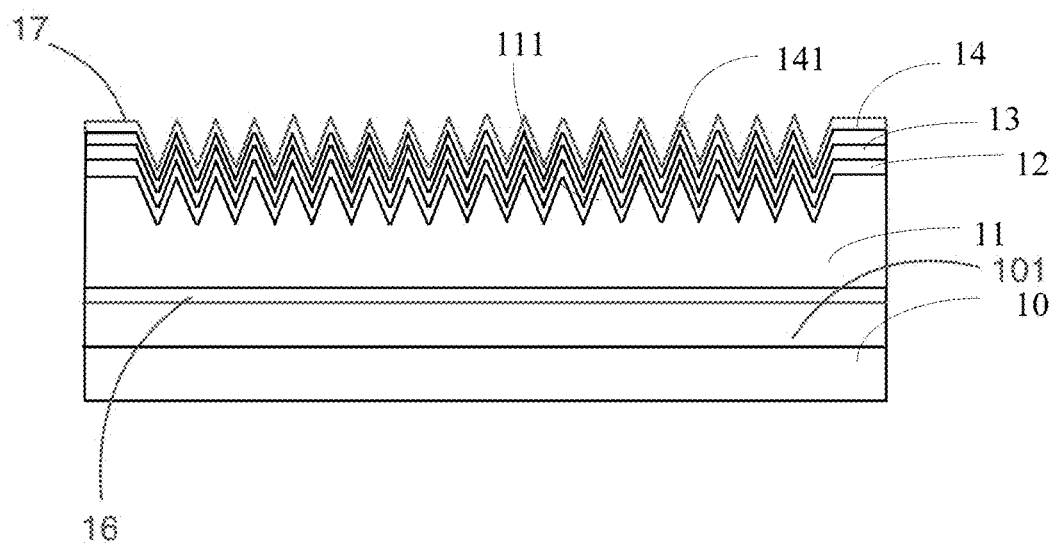
FIG. 1 is a schematic view of the OLED component in accordance with one embodiment.
Figure 2:
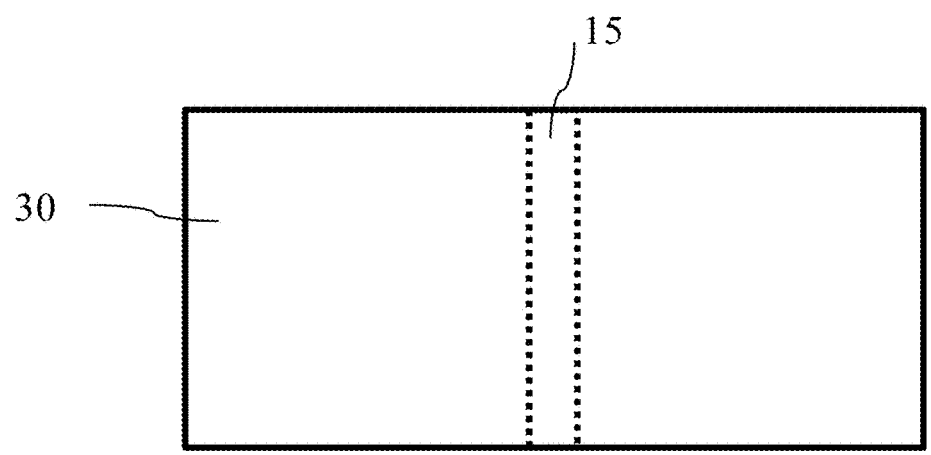
FIG. 2 is a schematic view of the display panel incorporated with the OLED component of FIG. 1.

Referring to FIGS. 1 and 2, the OLED component package structure is applicable to the OLED component. In particular, the OLED component package structure is applicable to the flexible OLED component. The OLED component includes an OLED body 10 and at least one encapsulation layer (not shown). The encapsulation layer includes an organic layer 11, a protection layer 12, a blocking layer 13, and a stressed layer 14. The organic layer 11 is provided with a first curved-surface area 111. The protection layer 12, the blocking layer 13, and the stressed layer 14 are stacked on the organic layer 11 in sequence. The protection layer 12, the blocking layer 13, and the stressed layer 14 are respectively provided with a second curved-surface area. The second curved-surface area is stacked on the organic layer 11 and is overlapped with the first curved-surface area 111 to form a folded area 15 of the OLED component. It is to be noted that the projections of the second curved-surface area and the first curved-surface area 111 are overlapped on the OLED body 10, and the second curved-surface area is stacked on the first curved-surface area to form the folded area 15.

The OLED component includes a plurality of stacked encapsulation layered, and the organic layer and the stressed layer of every two adjacent encapsulation layers are bonded together. That is, according to real scenario, the organic layer and the inorganic layer of different layers may be configured to be alternated. In the embodiment, the OLED includes one encapsulation layer. The OLED body 10 includes a cathode layer 101. The encapsulation layer is adhered to the cathode layer 101, and a blocking protection layer 16 is configured between the cathode layer 101 and the organic layer 11.

Further, the first curved-surface area of the organic layer 11 is formed by a plurality of cones, or trenches periodically arranged in a matrix, and the cones or the trenches are spaced apart from each other. The first curved-surface area is formed by imprint via the mold, wherein the cone may be a four-surface cone or a circular cone. The cross section of the trench may be triangular or arc-shaped. In particular, the four-surface cone, the circular cone, triangular trench, or arc-shaped trench is formed on a surface of the mold to imprint the thin film such that the corresponding curved-surface area may be formed. Referring to FIG. 2, the surface of the mold includes an imprinting surface having the four-surface cones arranged in the matrix and the cones are spaced apart from each other. The organic layer 11 is configured with a first curved-surface area by imprinting the organic layer 11 via the mold. When the protection layer 12, the blocking layer 13, and the stressed layer 14 are stacked on the organic layer 11, the second curved-surface area are respectively formed on the above layers in accordance with the first curved-surface area.

The protection layer 12 may be made by transparent metal, including but not limited to Al, and Ag. The transparent metal is inorganic material and the thickness is configured to be smaller than a specific thickness. The protection layer 12 protects the organic layer 11.

The blocking layer 13 is made by depositing the inorganic material, including but not limited to $Al_2O_3$, $SiN_x$, $TiO_2$, $SiO_x$, on the protection layer via the Plasma Enhanced Chemical Vapor Deposition (PECVD) process.

The stressed layer 14 is made by depositing the transparent polymer material, including but not limited to, HMDSO pp-HMDSO (Plasma Polymerized HMDSO), polyacrylates, PC, PS. The stressed layer 14 eases the stress generated in a folding and curling process of the blocking layer.

Further, an inorganic layer 17 is stacked on the stressed layer 14. The organic layers and the inorganic layers are alternately arranged on the OLED body 10 to form the thin film of the encapsulation layer. In such configuration, the water and oxygen may be effectively blocked such that the folded and the curled life cycle are extended. It can be understood that the materials of the blocking layer and the inorganic layer may be the same or different.

In FIG. 2, the OLED component includes one folded area 15. It can be understood that the OLED component may include a plurality of folded areas 15 parallel to each other, and the folded areas 15 are spaced apart from each other. The OLED component having a plurality of folded areas 15 is suitable for being folded a plurality of times. When the folded areas 15 occupy the whole display area, the OLED component may be curled and is flexible.

Figure 3:
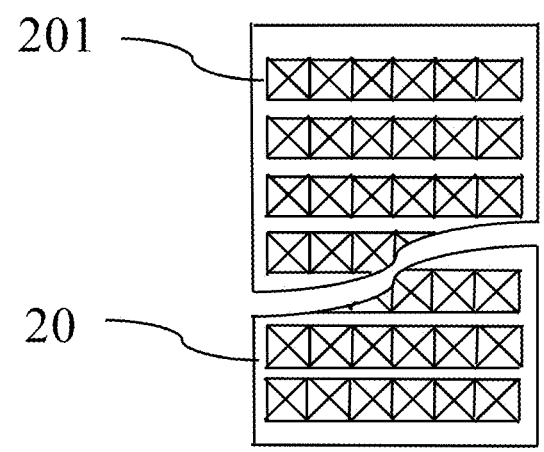
FIG. 3 is a schematic view of the mold manufacturing the first curved-surface area of the organic layer of the OLED component package structure of FIG. 1.
Figure 4:
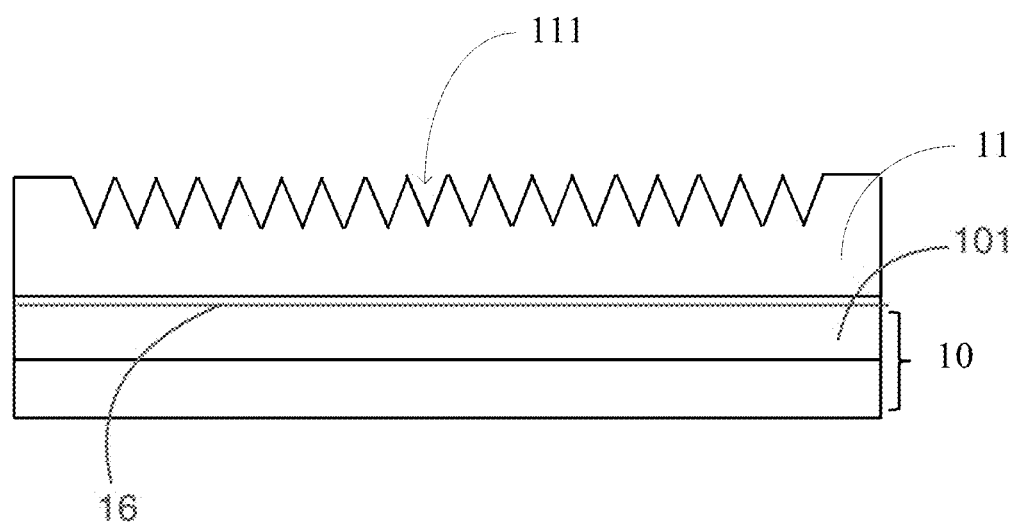
FIGS. 4-6 are schematic views showing the steps of the OLED component package structure of FIG. 1.
Figure 5:
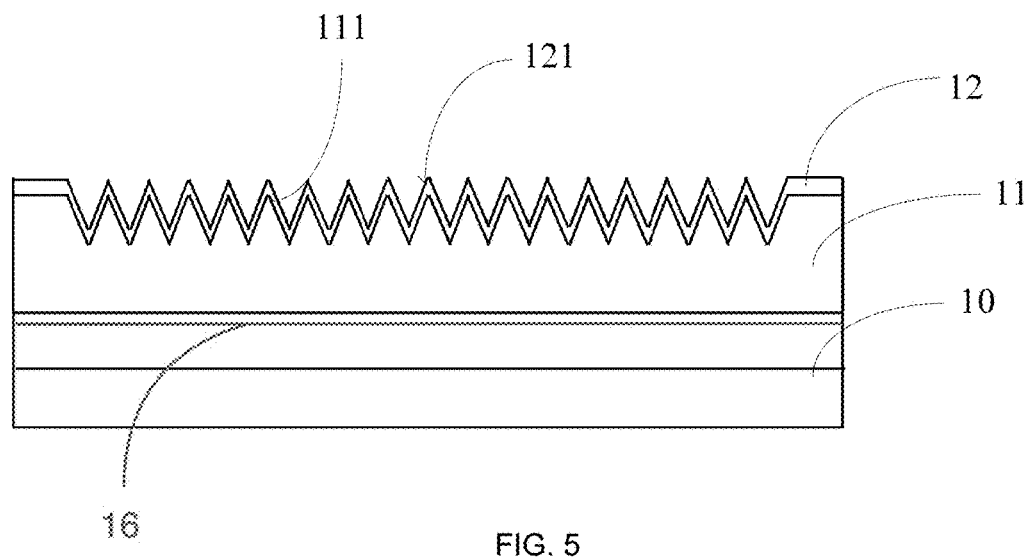
Figure 6:
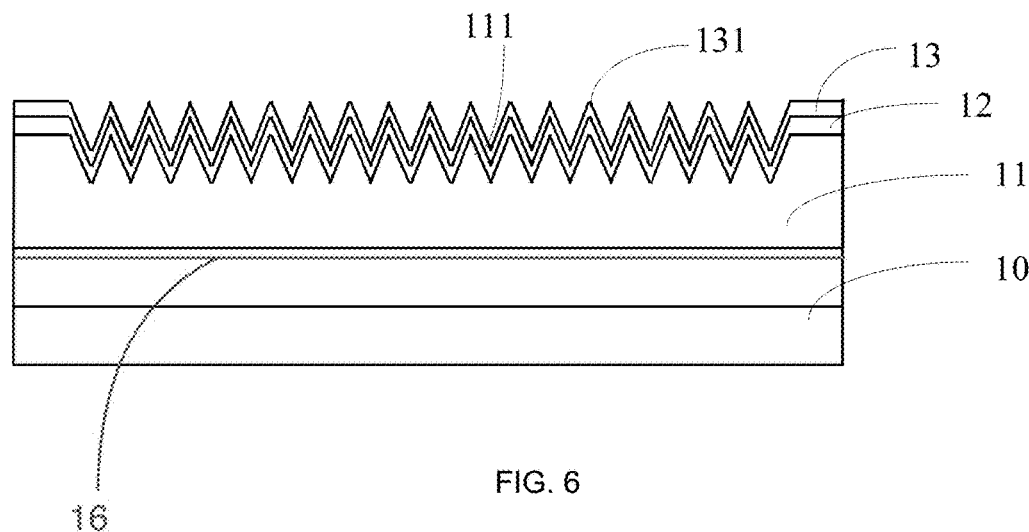

FIG. 3 shows the manufacturing steps of the encapsulation layer. In step 1, providing a mold 20 and an OLED body 10 configured with the organic layer 11. The mold 20 includes an imprinting surface 201 having a plurality of four-surface cones protruding from a surface of the mold 20, the four-surface cones are arranged in a matrix and are spaced apart from each other. In step 2, imprinting the organic layer 11 by the imprinting surface 201 of the mold 20 to form a first curved-surface area 111 on the surface of the organic layer 11 (see FIG. 4). In step 3, forming a protection layer 12 on the surface of the organic layer 11 via applying a vacuum evaporation process to transparent metal. At the same time, a second curved-surface area 121 is formed on the protection layer 12 in accordance with the first curved-surface area 111 (see FIG. 5). In step 4, applying a depositing process toward the protection layer 12 to form the blocking layer 13. At the same time, a second curved-surface area 131 is formed on the blocking layer 13 in accordance with the first curved-surface area 111 (see FIG. 6). In step 5, applying the depositing process toward the blocking layer 13 to form a stressed layer 14. At the same time, a second curved-surface area 141 is formed on the stressed layer 14 in accordance with the first curved-surface area 111 (see FIG. 1).

Compared to the conventional thin film having a flat surface, the organic layer 11 and the stressed layer 14 of the claimed invention may effectively ease the stress generated when the OLED component is folded or curled by configuring the alternately arranged inorganic thin films and organic thin films. At the same time, the protection layer 12 and the blocking layer 13 having curved surfaces may extend the penetration path within the thin film encapsulation layer with respect to water and oxygen so as to obtain better folding or curling effect. Also, the life cycle of the flexible OLED may be extended. The folded area 15 is imprinted with specific shapes by the mold, the manufacturing process is simple and the cost is low.

The present disclosure also includes a flexible display panel incorporating the OLED component. The OLED component includes the above component package structure. By incorporating the above package structure, the life cycle of the flexible display panel may be extended.

Above are embodiments of the present invention, which does not limit the scope of the present invention. Any modifications, equivalent replacements or improvements within the spirit and principles of the embodiment described above should be covered by the protected scope of the invention.

What is claimed is:

1. A package structure of organic light emitting diode (OLED) components, comprising:
   an OLED body and an encapsulation layer having an organic layer, a protecting layer, a blocking layer, and a stressed layer;
   a first curved-surface area is formed on the organic layer, the protecting layer, the blocking layer, and the stressed layer are stacked on the organic layer in sequence, the protecting layer, the blocking layer, and the stressed layer are respectively formed with a second curved-surface area, the second curved-surface area is stacked on the first curved-surface area and is overlapped with the first curved-surface area, and the second curved-surface area and the first curved-surface area form a folded area of the encapsulation layer;
   wherein the first curved-surface area comprises a plurality of periodic cones arranged in a matrix, and the cones are spaced apart from each other.

2. The packing structure of OLED components as claimed in claim 1, wherein the packing structure comprises a plurality of encapsulation layers and the encapsulation layer are stacked, and the organic layer and the stressed layers of every two adjacent encapsulation layers are bonded together.

3. The packing structure of OLED components as claimed in claim 1, wherein an inorganic layer is stacked on the stressed layer.

4. The packing structure of OLED components as claimed in claim 1, wherein the protection layer is formed on the organic layer by applying a vacuum evaporation process to transparent metal.

5. The packing structure of OLED components as claimed in claim 1, wherein the blocking layer is formed by depositing inorganic material on the protection layer.

6. The packing structure of OLED components as claimed in claim 1, wherein the stressed layer is made by polymer material.

7. The packing structure of OLED components as claimed in claim 1, wherein the packing structure comprises one folded area or a plurality of spaced folded areas.

8. An OLED component, comprising:
   an OLED body and a encapsulation layer having an organic layer, a protecting layer, a blocking layer, and a stressed layer;
   a first curved-surface area is formed on the organic layer, the protecting layer, the blocking layer, and the stressed layer are stacked on the organic layer in sequence, the protecting layer, the blocking layer, and the stressed layer are respectively formed with a second curved-surface area, the second curved-surface area is stacked on the first curved-surface area and is overlapped with the first curved-surface area, and the second curved-surface area and the first curved-surface area form a folded area of the encapsulation layer;
   wherein the first curved-surface area comprises a plurality of periodic cones arranged in a matrix, and the cones are spaced apart from each other.

9. The OLED component as claimed in claim 8, wherein the packing structure comprises a plurality of encapsulation layers and the encapsulation layer are stacked, and the organic layer and the stressed layers of every two adjacent encapsulation layers are bonded together.

10. The OLED component as claimed in claim 8, wherein an inorganic layer is stacked on the stressed layer.

11. The OLED component as claimed in claim 8, wherein the protection layer is formed on the organic layer by applying a vacuum evaporation process to transparent metal.

12. The OLED component as claimed in claim 8, wherein the blocking layer is formed by depositing inorganic material on the protection layer.

13. The OLED component as claimed in claim 8, wherein the stressed layer is made by polymer material.

14. The OLED component as claimed in claim 8, wherein the packing structure comprises one folded area or a plurality of spaced folded areas.

15. A display panel comprises the OLED component as claimed in claim 8.

* * * * *